US012652902B2

(12) United States Patent
Song et al.

(10) Patent No.: US 12,652,902 B2
(45) Date of Patent: Jun. 9, 2026

(54) DISPLAY DEVICE

(71) Applicant: Samsung Display Co., LTD., Yongin-si (KR)

(72) Inventors: Hyunseop Song, Bucheon-si (KR); Jooyoung Kim, Asan-si (KR); Young-Joo Nam, Suwon-si (KR); Byungchul Shin, Gwangju-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 973 days.

(21) Appl. No.: 17/885,640

(22) Filed: Aug. 11, 2022

(65) Prior Publication Data

US 2023/0143214 A1 May 11, 2023

(30) Foreign Application Priority Data

Nov. 10, 2021 (KR) ........................ 10-2021-0154328

(51) Int. Cl.
*H10K 50/844* (2023.01)
*H05K 1/02* (2006.01)

(52) U.S. Cl.
CPC ......... *H10K 50/844* (2023.02); *H05K 1/0266* (2013.01)

(58) Field of Classification Search
CPC ................ H10K 50/844; H05K 1/0266; G02F 1/133374
See application file for complete search history.

(56) References Cited

U.S. PATENT DOCUMENTS

| | | | | |
|---|---|---|---|---|
| 5,768,107 | A | * | 6/1998 | Ouchi .................. H05K 1/0269 |
| | | | | 361/792 |
| 8,212,969 | B2 | * | 7/2012 | Kim ................... G01M 11/0221 |
| | | | | 349/95 |
| 2014/0184951 | A1 | * | 7/2014 | Yeh .......................... G06F 3/044 |
| | | | | 349/12 |
| 2016/0165725 | A1 | | 6/2016 | Song et al. |
| 2017/0090227 | A1 | | 3/2017 | Yun et al. |
| 2022/0197079 | A1 | * | 6/2022 | Li .......................... G06F 1/1637 |

FOREIGN PATENT DOCUMENTS

| KR | 1020070043370 | A | 4/2007 |
|---|---|---|---|
| KR | 1020070106261 | A | 11/2007 |
| KR | 1020070117110 | A | 12/2007 |
| KR | 20160069572 | A | 6/2016 |
| KR | 20170038964 | A | 4/2017 |
| KR | 20170071098 | A | 6/2017 |
| KR | 10-2023923 | B1 | 9/2019 |

* cited by examiner

*Primary Examiner* — David Y Chung
(74) *Attorney, Agent, or Firm* — CANTOR COLBURN LLP

(57) ABSTRACT

The display device includes a display panel, a circuit board having a first surface facing a bottom of the display panel and a second surface opposite to the first surface, and a cover member attached to the bottom of the display panel to cover the second surface of the circuit board. A first alignment mark is formed on the second surface of the circuit board, and a second alignment mark corresponding to the first alignment mark is formed in a transparent area of the cover member.

20 Claims, 15 Drawing Sheets

F I G. 2
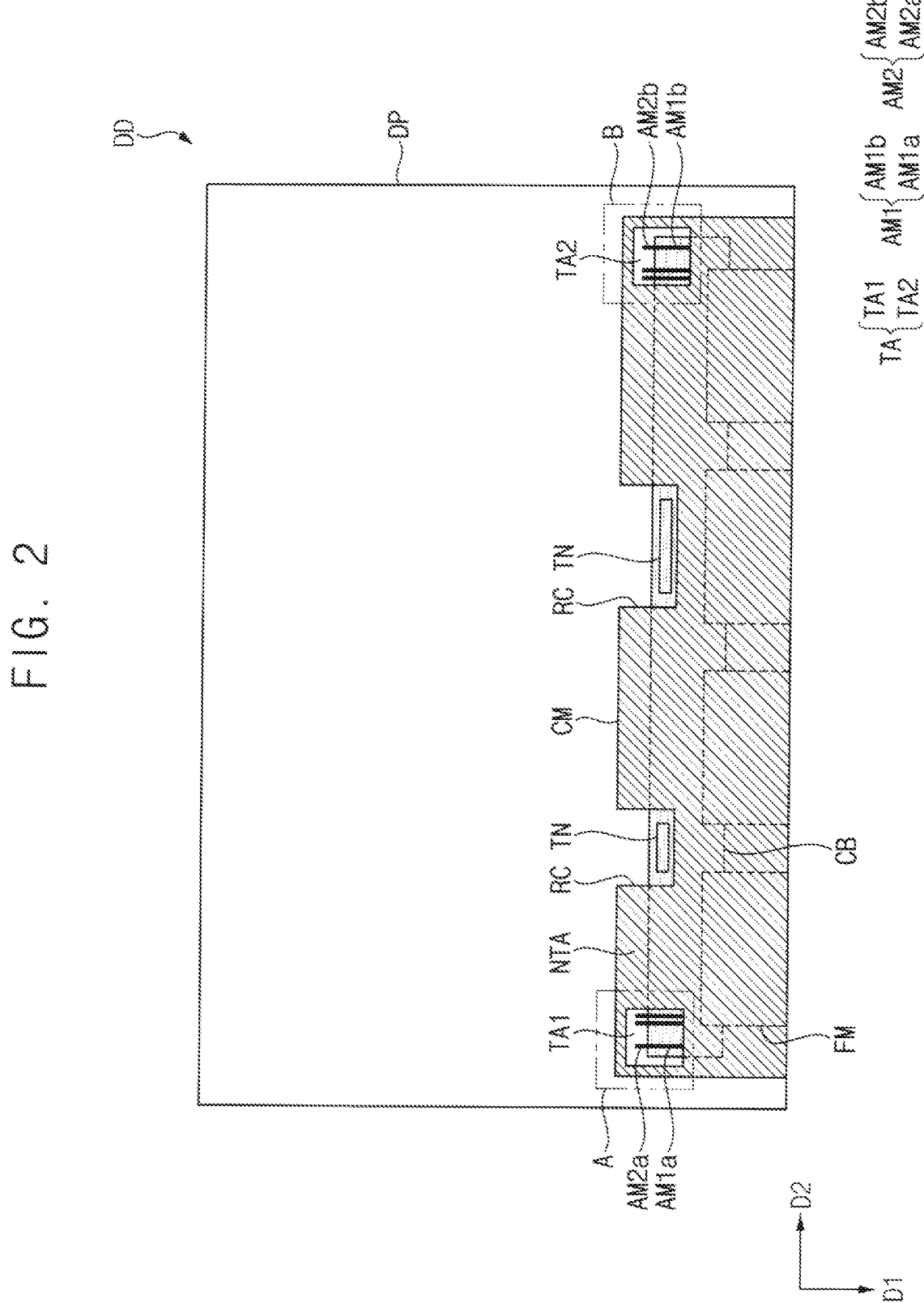

FIG. 6

F I G. 7
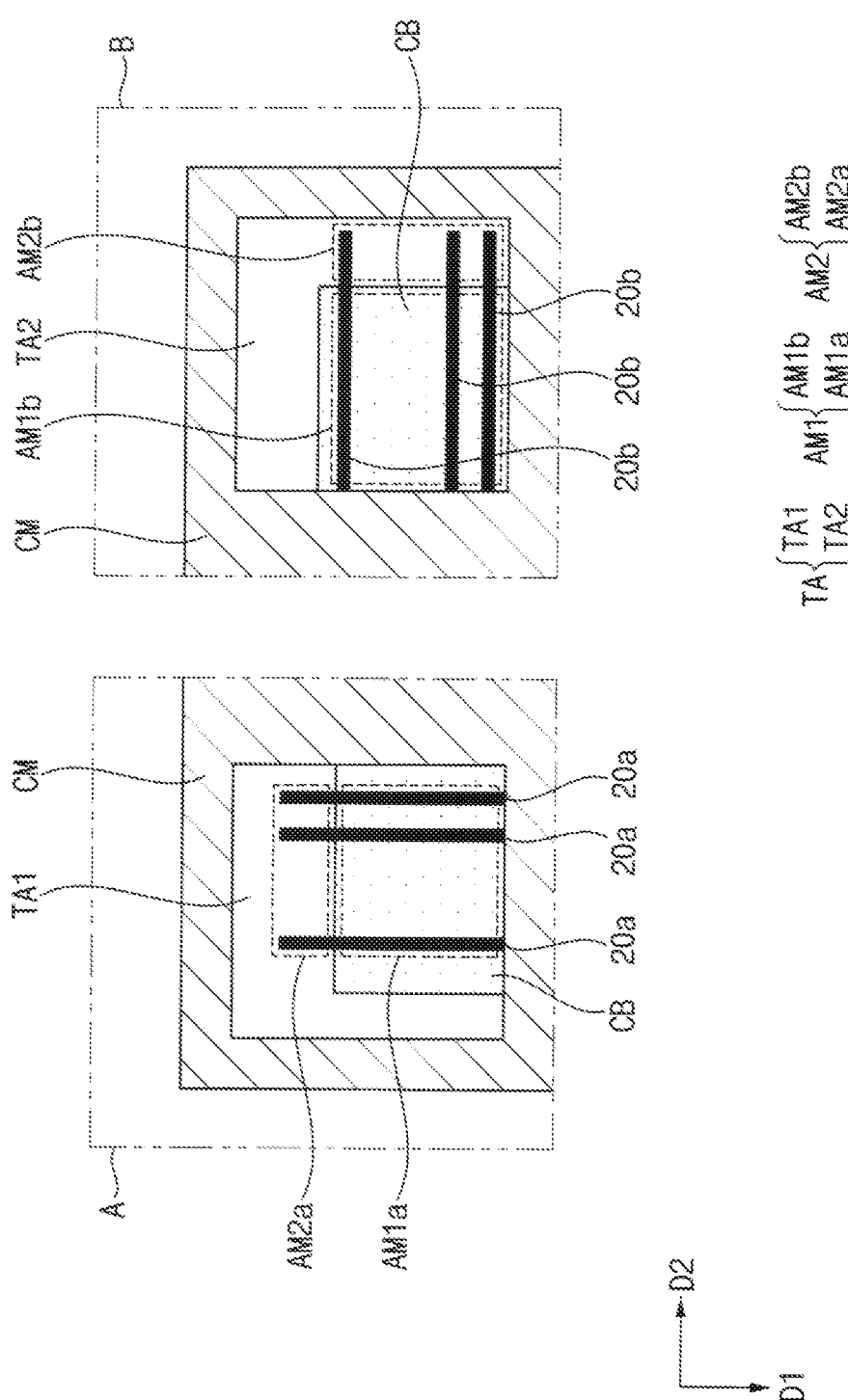

F I G. 8
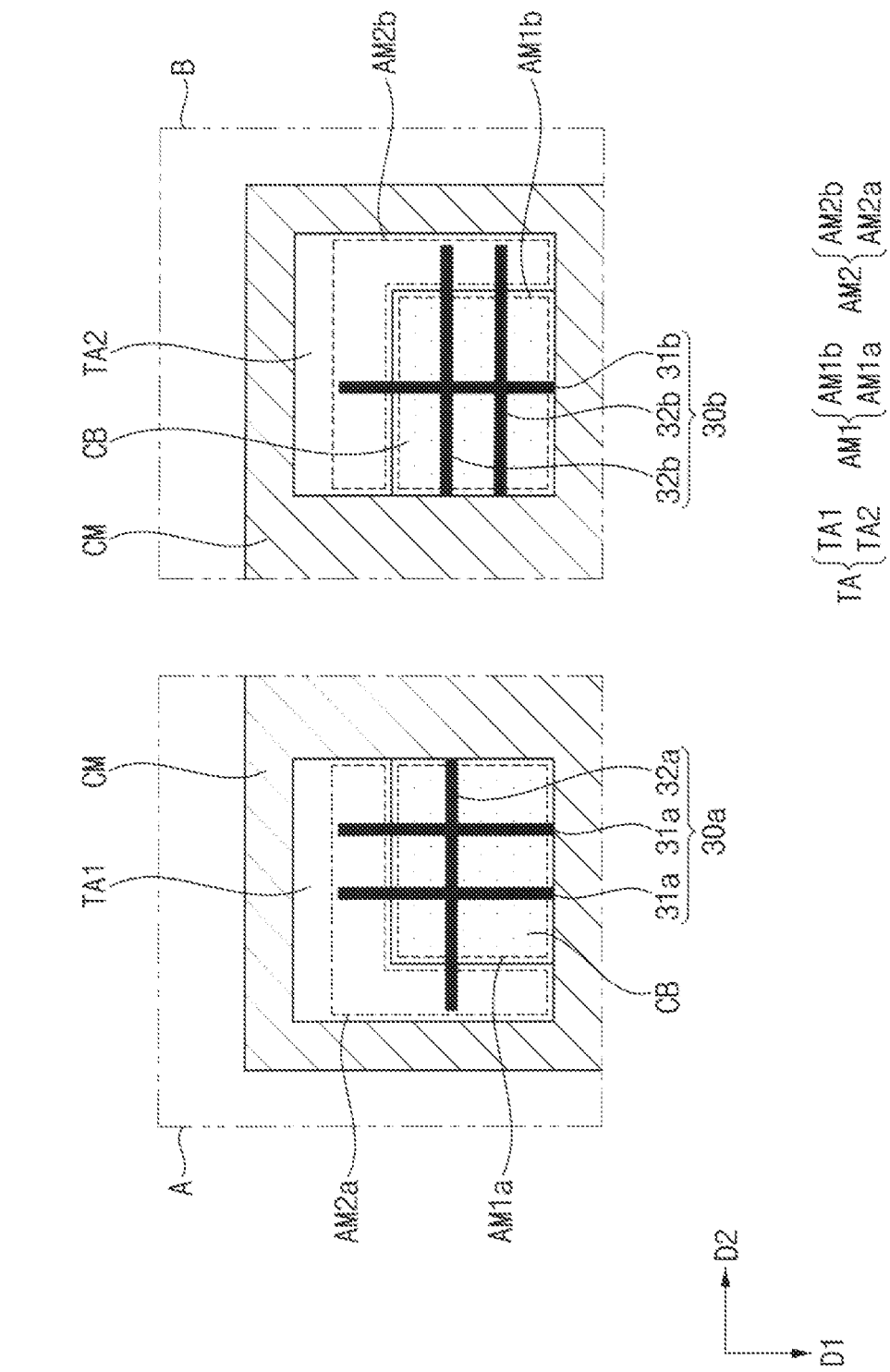

DISPLAY DEVICE

This application claims priority to Korean Patent Application No. 10-2021-0154328, filed on Nov. 10, 2021, and all the benefits accruing therefrom under 35 U.S.C. § 119, the content of which in its entirety is herein incorporated by reference.

BACKGROUND

(1) Field

Implementations of the invention relate generally to a display device.

(2) Discussion of the Related Art

A flat panel display is used as a display device that replaces a cathode ray tube display, due to characteristics such as light weight and thinness. Representative examples of such flat panel display devices include a liquid crystal display device and an organic light emitting display device.

The display device may include a display panel that displays an image and a circuit board which is electrically connected to the display panel. In order to reduce the bezel of the display device, the circuit board may be disposed under the display panel. In addition, in order to protect the circuit board, a cover member may be attached to a bottom surface of the display panel to cover the circuit board.

SUMMARY

Embodiments provide a display device with improved reliability.

A display device according to an embodiment includes a display panel configured to display an image, a circuit board on a bottom surface of the display panel, having a first surface facing the bottom surface of the display panel and a second surface opposite to the first surface, and having a first alignment mark on the second surface, and a cover member attached to the bottom surface of the display panel to cover the second surface of the circuit board, including a transparent area overlapping the first alignment mark, and having a second alignment mark corresponding to the first alignment mark in the transparent area.

In an embodiment, the second alignment mark may have a shape in which the first alignment mark extends.

In an embodiment, the first alignment mark may include stripe patterns.

In an embodiment, the stripe patterns may extend in a first direction and may be arranged in a second direction which crosses the first direction (such as being perpendicular to the first direction).

In an embodiment, at least one of the stripe patterns may extend in a first direction, and at least another one of the stripe patterns may extend in a second direction perpendicular to the first direction.

In an embodiment, each of the first alignment mark and the second alignment mark may include a colored ink or a colored tape.

In an embodiment, the first alignment mark may have a color different from a color of the second alignment mark.

In an embodiment, the first alignment mark may include a 1-1st alignment mark and a 1-2nd alignment mark spaced apart from each other.

In an embodiment, the 1-1st alignment mark may have a shape different from a shape of the 1-2nd alignment mark.

In an embodiment, the 1-1st alignment mark and the 1-2nd alignment mark may be respectively on opposing ends of the circuit board.

In an embodiment, the cover member may include a first transparent area and a second transparent area, the first transparent area may overlap the 1-1st alignment mark, and the second transparent area may overlap the 1-2nd alignment mark and be spaced apart from the first transparent area.

In an embodiment, the second alignment mark may include a 2-1st alignment mark and a 2-2nd alignment mark, the 2-1st alignment mark may correspond to the 1-1st alignment mark and is in the first transparent area, and the 2-2nd alignment mark may correspond to the 1-2nd alignment mark and is in the second transparent area.

In an embodiment, the 2-1st alignment mark may have a shape in which the 1-1st alignment mark extends, and the 2-2nd alignment mark may have a shape in which the 1-2nd alignment mark extends.

In an embodiment, the 1-1st alignment mark may include first stripe patterns, and the 1-2nd alignment mark may include second stripe patterns.

In an embodiment, the first stripe patterns may extend in a first direction and be arranged in a second direction perpendicular to the first direction, and the second stripe patterns may extend in the first direction and be arranged in the second direction.

In an embodiment, the first stripe patterns may extend in a first direction and be arranged in a second direction perpendicular to the first direction, and the second stripe patterns may extend in the second direction and be arranged in the first direction.

In an embodiment, at least one of the first stripe patterns may extend in a first direction, at least another one of the first stripe patterns may extend in a second direction perpendicular to the first direction, at least one of the second stripe patterns may extend in the first direction, and at least another one of the second stripe patterns may extend in the second direction.

In an embodiment, the cover member may include a transparent adhesive layer, a conductive layer under the transparent adhesive layer and defining an opening overlapping the transparent area, a first transparent film under the conductive layer and defining an opening overlapping the transparent area, and a second transparent film under the first transparent film, overlapping the transparent area, and having the second alignment mark in the transparent area on a bottom surface.

A display device according to an embodiment includes a display panel configured to display an image, a circuit board on a bottom surface of the display panel, having a first surface facing the bottom surface of the display panel and a second surface opposite to the first surface, and having a 1-1st alignment mark and a 1-2nd alignment mark at opposing ends of the circuit board and on the second surface, and a cover member attached to the bottom surface of the display panel to cover the second surface of the circuit board, including a first transparent area overlapping the 1-1st alignment mark and a second transparent area overlapping the 1-2nd alignment mark, having a 2-1st alignment mark corresponding to the 1-1st alignment mark in the first transparent area, and having a 2-2nd alignment mark corresponding to the 1-2nd alignment mark in the second transparent area.

In an embodiment, the 2-1st alignment mark may have a shape in which the 1-1st alignment mark extends, and the 2-2nd alignment mark may have a shape in which the 1-2nd alignment mark extends.

Therefore, a display device according to one or more embodiments of the invention may include a display panel, a circuit board under the display panel, and a cover member attached to a bottom surface of the display panel to cover the circuit board. A first alignment mark may be on the bottom surface of the circuit board. The cover member may include a transparent area overlapping the first alignment mark, and a second alignment mark corresponding to the first alignment mark may be in the transparent area of the cover member. Accordingly, the cover member may be precisely aligned for attachment to the bottom surface of the display panel and/or the circuit board, by using the first and second alignment marks. Accordingly, it is possible to prevent or reduce interference between a circuit structure (e.g., a driving integrated circuit, a line, etc.) in the circuit board and the cover member due to misalignment of the cover member. Accordingly, the reliability of the display device may be improved.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

FIG. 2 is a bottom view illustrating the display device of FIG. 1.

FIGS. 6 to 12 are bottom views of area A and area B of FIG. 2.

DETAILED DESCRIPTION

Figure 1:
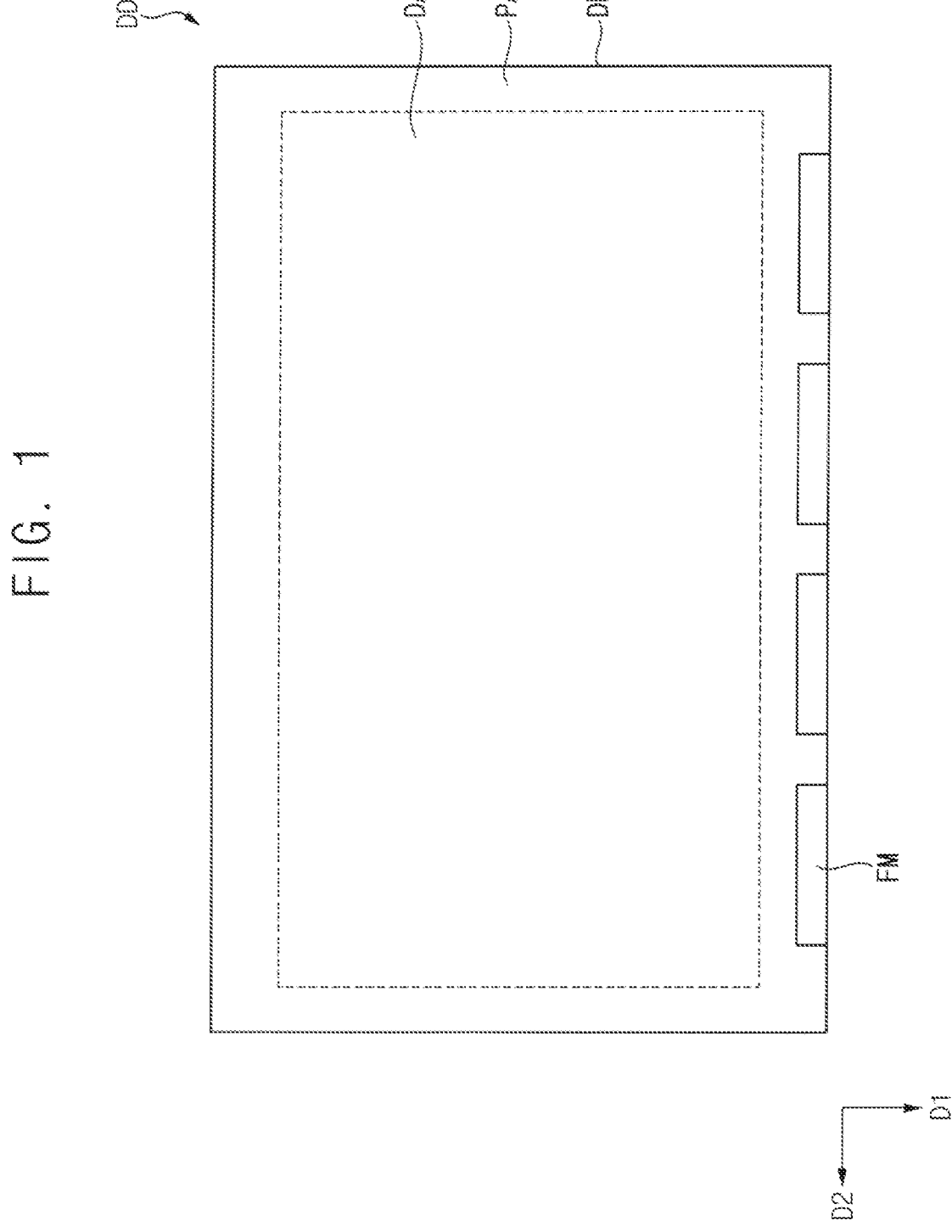
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. As used herein, a reference number may indicate a singular element or a plurality of the element. For example, a reference number labeling a singular form of an element within the drawing figures may be used to reference a plurality of the singular element within the text of specification.

"At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

FIG. 1 is a plan (top) view illustrating a display device DD according to an embodiment. FIG. 2 is a bottom view illustrating the display device DD of FIG. 1.

Referring to FIGS. 1 and 2, a display device DD according to an embodiment may include a display panel DP, flexible films FM, a circuit board CB, and a cover member CM.

The display panel DP may include a display area DA in which an image is displayed and a peripheral area PA which is adjacent to the display area DA, such as being around the display area DA. The peripheral area PA may be located outside the display area DA. For example, the peripheral area PA may surround the display area DA in a plan view.

The display panel DP may include a plurality of pixels. For example, the pixels may be arranged in a matrix in the display area DA, along a first direction D1 and a second direction D2 which crosses the first direction D1, such as being perpendicular to the first direction D1, but the invention is not limited.

Each of the pixels may include a driving element and an emission element. The driving element and the emission element are connected to each other to generate and/or emit light, display an image, etc. The driving element may include at least one thin film transistor. The emission element may generate and/or emit light according to a driving signal. For example, the emission element may be an inorganic light emitting diode or an organic light emitting diode. Lights emitted from each of the pixels may be combined to generate the image.

Figure 3:
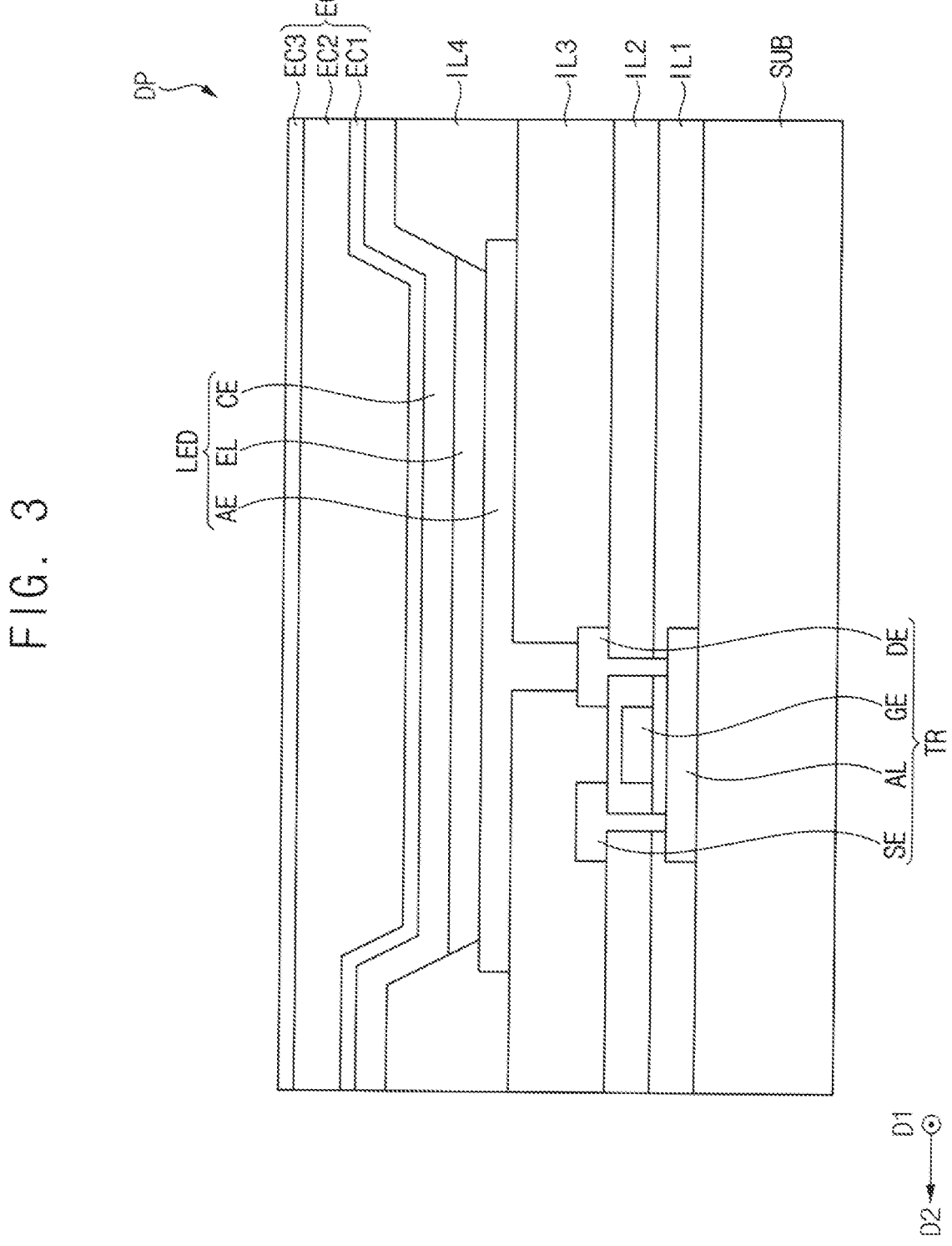
FIG. 3 is a cross-sectional view illustrating a display panel included in the display device of FIG. 1.

FIG. 3 is a cross-sectional view illustrating a display panel DP included in the display device DD of FIG. 1. For example, FIG. 3 is a cross-sectional view illustrating a portion of the display area DA of the display panel DP. A thickness of the display device DD and various components or layers thereof may extend along a third direction crossing each of the first direction D1 and the second direction D2. A thickness direction may correspond to the vertical direction in FIG. 3.

Referring to FIG. 3, in an embodiment, the display panel DP may include a substrate SUB, a thin film transistor TR as a switching element (or transistor), a light emitting diode LED as a light emitting element (or display element), and an encapsulation layer EC.

The substrate SUB may be an insulating substrate formed of (or including) a transparent or opaque material. In an embodiment, the substrate SUB may include glass. In this case, the display panel DP may be a rigid display panel. In an embodiment, the substrate SUB may include plastic. In this case, the display panel DP may be a flexible display panel.

An active layer AL may be disposed on the substrate SUB. The active layer AL may include an oxide semiconductor, a silicon semiconductor, an organic semiconductor, or the like. For example, the oxide semiconductor may include at least one oxide among indium ("In"), gallium ("Ga"), tin ("Sn"), zirconium ("Zr"), vanadium ("V"), hafnium ("Hf"), cadmium ("Cd"), germanium ("Ge"), chromium ("Cr"), titanium ("Ti"), and zinc ("Zn"), but the invention is not limited thereto. The silicon semiconductor may include amorphous silicon, polycrystalline silicon, or the like. The active layer AL may include a source area, a drain area, and a channel area positioned between the source area and the drain area.

In an embodiment, although not shown, a buffer layer may be disposed between the substrate SUB and the active layer AL. The buffer layer may prevent impurities from diffusing from the substrate SUB to the active layer AL. The buffer layer may include an inorganic insulating material such as a silicon compound or a metal oxide. Examples of the inorganic insulating material may include silicon oxide ("SiO"), silicon nitride ("SiN"), silicon oxynitride ("SiON"), silicon oxycarbide ("SiOC"), silicon carbonitride ("SiCN"), aluminum oxide ("AlO"), aluminum nitride ("AlN"), tantalum oxide ("TaO"), hafnium oxide ("HfO"), zirconium oxide ("ZrO"), titanium oxide ("TiO"), and the like, but the invention is not limited thereto. These may be used alone or in combination with each other. The buffer layer may have a single-layer structure or a multi-layer structure including a plurality of insulating layers.

A first insulating layer IL1 may be disposed on the active layer AL. The first insulating layer IL1 may cover the active layer AL on the substrate SUB. The first insulating layer IL1 may include an inorganic insulating material.

A gate electrode GE may be disposed on the first insulating layer IL1. The gate electrode GE may overlap the channel area of the active layer AL. The gate electrode GE may include a conductive material such as a metal, an alloy, a conductive metal nitride, a conductive metal oxide, or a transparent conductive material. Examples of the conductive material may include gold ("Au"), silver ("Ag"), aluminum ("Al"), platinum ("Pt"), nickel ("Ni"), titanium ("Ti"), palladium ("Pd"), magnesium ("Mg"), calcium ("Ca"), lithium ("Li"), chromium ("Cr"), tantalum ("Ta"), tungsten ("W"), copper ("Cu"), molybdenum ("Mo"), scandium ("Sc"), neodymium ("Nd"), iridium ("Ir"), alloys containing aluminum, alloys containing silver, alloys containing copper, alloys containing molybdenum, aluminum nitride ("AlN"), tungsten nitride ("WN"), titanium nitride ("TiN"), chromium nitride ("CrN"), tantalum nitride ("TaN"), strontium ruthenium oxide ("SrRuO"), zinc oxide ("ZnO"), indium tin oxide ("ITO"), tin oxide ("SnO"), indium oxide ("InO"), gallium oxide ("GaO"), indium zinc oxide ("IZO") and the like, but the invention is not limited thereto. These may be used alone or in combination with each other. The gate electrode GE may have a single-layer structure or a multi-layer structure including a plurality of conductive layers.

A second insulating layer IL2 may be disposed on the gate electrode GE. The second insulating layer IL2 may cover the gate electrode GE on the first insulating layer IL1. The second insulating layer IL2 may include an inorganic insulating material.

A source electrode SE and a drain electrode DE may be disposed on the second insulating layer IL2. The source electrode SE and the drain electrode DE may be respectively connected to the source area and the drain area of the active layer AL. Each of the source electrode SE and the drain electrode DE may include a conductive material. The active layer AL, the gate electrode GE, the source electrode SE, and the drain electrode DE may form the thin film transistor TR.

A third insulating layer IL3 may be disposed on the source electrode SE and the drain electrode DE. The third insulating layer IL3 may include an organic insulating material. Examples of the organic insulating material may include photoresist, polyacryl-based resin, polyimide-based resin, polyamide-based resin, siloxane-based resin, acrylic resin, epoxy-based resin, etc., but the invention is not limited thereto. These may be used alone or in combination with each other. In an embodiment, the third insulating layer IL3 may have a multilayer structure including one or more organic insulating layers and one or more inorganic insulating layers.

An anode electrode AE may be disposed on the third insulating layer IL3. The anode electrode AE may include a conductive material. The anode electrode AE may be connected to the source electrode SE or the drain electrode DE, at or through a contact hole formed (or provided) in the third insulating layer IL3. Accordingly, the anode electrode AE as the emission element may be electrically connected to the thin film transistor TR.

A fourth insulating layer IL4 may be disposed on the anode electrode AE. The fourth insulating layer IL4 may cover a peripheral portion of the anode electrode AE and define a pixel opening exposing a central portion of the anode electrode AE to outside the fourth insulating layer IL4. The fourth insulating layer IL4 may include an organic insulating material. The fourth insulating layer IL4 may be considered a pixel-defining layer, without being limited thereto.

An emission layer EL may be disposed on the anode electrode AE. The emission layer EL may be disposed in the pixel opening of the fourth insulating layer IL4. The emission layer EL may include at least one of an organic light emitting material and quantum dots.

In an embodiment, the organic light emitting material may include a low molecular weight organic compound or a high molecular weight organic compound. Examples of the low molecular weight organic compound may include copper phthalocyanine, diphenylbenzidine (N,N'-diphenylbenzidine), tris-(8-hydroxyquinoline)aluminum, and the like. Examples of the high molecular weight organic compound may include poly(3,4-ethylenedioxythiophene, polyaniline, polyphenylenevinylene, polyfluorene, etc., but the invention is not limited thereto. These may be used alone or in combination with each other.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including the core and a shell surrounding the core. The shell may serve as a protective layer for maintaining semiconductor properties by preventing chemical modification of the core and as a charging layer for imparting electrophoretic properties to the quantum dots.

A cathode electrode CE may be disposed on the emission layer EL. The cathode electrode CE may also be disposed on the fourth insulating layer IL4. The cathode electrode CE may include a conductive material. The anode electrode AE, the emission layer EL, and the cathode electrode CE may form the light emitting diode LED.

The encapsulation layer EC may be disposed on the cathode electrode CE. The encapsulation layer EC may include at least one inorganic encapsulation layer and at least one organic encapsulation layer. In an embodiment, the encapsulation layer EC may include a first inorganic encapsulation layer EC1 disposed on the cathode electrode CE, an organic encapsulation layer EC2 disposed on the first inorganic encapsulation layer EC1, and a second inorganic encapsulation layer EC3 disposed on the organic encapsulation layer EC2.

In an embodiment, various layers such as a color conversion layer, a color filter layer, a touch sensing layer, a polarization layer, a protective layer, and/or a window may be further disposed on the encapsulation layer EC.

Referring back to FIGS. 1 and 2, each of the flexible films FM may include a first end and a second end which is opposite to the first end. The first end of each of the flexible films FM may be connected to the display panel DP at the peripheral area PA of the display panel DP. For example, the first end of each of the flexible films FM may be attached to the display panel DP at a top surface of the display panel DP (refer to FIG. 1). The second end of each of the flexible films FM may be connected to the circuit board CB (refer to FIG. 2).

In an embodiment, each of a flexible film FM among the plurality of the flexible films FM may be a flexible printed circuit board (FPCB). A data driver and/or a gate driver may be disposed on one surface of each of the flexible films FM. The data driver and/or the gate driver may be formed of an integrated circuit (IC). For example, the data driver and/or the gate driver may be directly mounted on one surface of each of the flexible films FM in a chip on film (COF) method.

As shown in FIGS. 1 and 2, each of the flexible films FM is bendable and may be bent such that the second end of a flexible film FM is positioned below the display panel DP. Accordingly, the circuit board CB may be disposed on the bottom surface of the display panel DP. That is, the display device DD is bendable to dispose a portion of the flexible film FM under the display panel DP.

The circuit board CB may include a first surface (e.g., a top surface) facing the bottom surface of the display panel DP (e.g., closest to the display panel DP), and a second surface (e.g., a bottom surface) opposite to the first surface (e.g., further from the display panel than the first surface). For example, the second end of each of the flexible films FM may be attached to the circuit board CB at the second surface of the circuit board CB.

The circuit board CB may be a printed circuit board (PCB). The circuit board CB may be electrically connected to the display panel DP, through the flexible films FM. For example, a driving controller may be disposed on the second surface of the circuit board CB. The driving controller may be formed of an integrated circuit (IC).

In an embodiment, at least one terminal TN connected to a connector, may be formed on the second surface of the circuit board CB. The circuit board CB may be connected to an external device through the connector.

A first alignment mark AM1 (e.g., first sub-alignment mark) for aligning the cover member CM may be formed on the second surface of the circuit board CB.

The cover member CM may be attached to the bottom surface of the display panel DP. The cover member CM may be directly attached to the bottom surface of the display panel DP (e.g., to the bottom surface of the substrate SUB included in the display panel DP) or a bottom surface of a lowermost layer (e.g., a protective film, heat dissipation sheet, etc.) disposed under the display panel DP. The cover member CM may cover the second surface of the circuit board CB to protect the circuit board CB during a process of manufacturing (or providing) the display device DD or during use of the display device DD.

The cover member CM may include a first surface (e.g., a top surface) facing the second surface of the circuit board CB (or the bottom surface of the display panel DP), and a second surface opposite to the first surface (e.g., a bottom surface).

The cover member CM may include an opaque area NTA and a transparent area TA. For example, the opaque area NTA may surround the transparent area TA in a plan view.

The transparent area TA may overlap (or correspond to) the first alignment mark AM1 of the circuit board CB. Accordingly, the first alignment mark AM1 may be visually recognized through the cover member CM at the transparent area TA of the cover member CM. A second alignment mark AM2 (e.g., second sub-alignment mark) corresponding to the first alignment mark AM1 of the circuit board CB, may be formed in the transparent area TA of the cover member CM. The second alignment mark AM2 of the cover member DM may be formed on the second surface of the cover member CM. The first alignment mark AM1 and the second alignment mark AM2 will be described in detail later.

The cover member CM has an outer edge defined by a protruding portion and a recessed portion between adjacent protruding portions, of the cover member CM. In an embodiment, a recess RC of the cover member CM which exposes the terminal TN of the circuit board CB to outside the cover member CM, may be formed in the cover member CM. Accordingly, the connector (not shown) may be connected to the terminal TN of the circuit board CB exposed to outside the cover member CM by the recess RC of the cover member CM. For example, when a plurality of terminals TN are provided, a plurality of recesses RC may also be provided to expose the plurality of terminals TN. In an embodiment, the cover member CM may cover the entire second surface of the circuit board CB. In an embodiment, the cover member CM may cover an entirety of the second surface of the circuit board CB, except for a planar area corresponding to a terminal TN.

Figure 4:
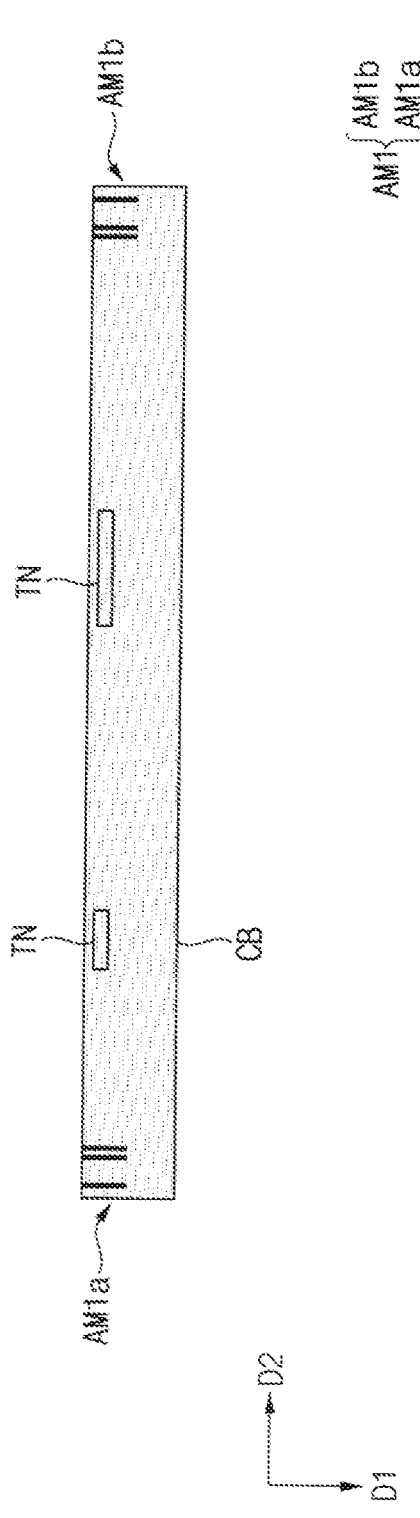
FIG. 4 is a bottom view illustrating a circuit board included in the display device of FIG. 2.

FIG. 4 is a bottom view illustrating a circuit board CB included in the display device DD of FIG. 2.

Referring to FIGS. 2 and 4, the first alignment mark AM1 for aligning the cover member CM may be formed on the second surface of the circuit board CB.

In an embodiment, the first alignment mark AM1 may be formed using a colored ink or a colored tape. For example, the first alignment mark AM1 may be formed on the second surface of the circuit board CB by printing colored ink or attaching a colored tape, using a silk screen printing method or the like. However, the invention is not limited thereto.

The first alignment mark AM1 of the circuit board CB may have a stripe shape pattern. In an embodiment, the first alignment mark AM1 may include one or more stripe shape patterns in a same one first alignment mark AM1. For example, each of the stripe patterns may extend in a direction (e.g., the first direction D1 or the second direction D2) and may be arranged in parallel with each other. That is, each of the stripe patterns may have a long dimension in the direction such that the stripe pattern extends in such direction. For another example, at least one of the stripe patterns may extend in the first direction D1, and at least another one of the stripe patterns may extend in the second direction D2. For another example, each of the stripe patterns may extend in a diagonal direction between the first direction D1 and the second direction D2.

In an embodiment, a plurality of first alignment marks AM1 may be provided. For example, as shown in FIG. 4, the first alignment mark AM1 may include a 1-1st alignment mark AM1a and a 1-2nd alignment mark AM1b that are spaced apart from each other, along an outer edge of the circuit board CB. However, the invention is not limited thereto. For example, one first alignment mark AM1 may be formed on the circuit board CB, or three or more first alignment marks AM1 spaced apart from each other may be formed. Hereinafter, an embodiment in which two first alignment marks AM1 are formed as shown in FIG. 4 will be mainly described.

In an embodiment, the 1-1st alignment mark AM1a and the 1-2nd alignment mark AM1b may be respectively formed at opposing ends of the circuit board CB. The 1-1st alignment mark AM1a may be formed at a first end (e.g., a left end in FIG. 4) of the circuit board CB. For example, the 1-1st alignment mark AM1a may be formed at the upper left corner of the circuit board CB. The 1-2nd alignment mark AM1b may be formed at a second end (e.g., a right end in FIG. 4) opposite to the first end of the circuit board CB. For example, the 1-2nd alignment mark AM1b may be formed at an upper right corner of the circuit board CB. However, the invention is not limited thereto. For example, each of the 1-1st alignment mark AM1a and the 1-2nd alignment mark AM1b may be formed on a central portion, an upper portion, or a lower portion of the circuit board CB.

In an embodiment, the 1-1st alignment mark AM1a may have a shape different from a shape of the 1-2nd alignment mark AM1b. In an embodiment, the 1-1st alignment mark AM1a and the 1-2nd alignment mark AM1b may have the same or symmetrical shape.

In one embodiment, each of the 1-1st alignment mark AM1a and the 1-2nd alignment mark AM1b may include stripe patterns. This will be described later in detail with reference to FIG. 6.

Figure 5:
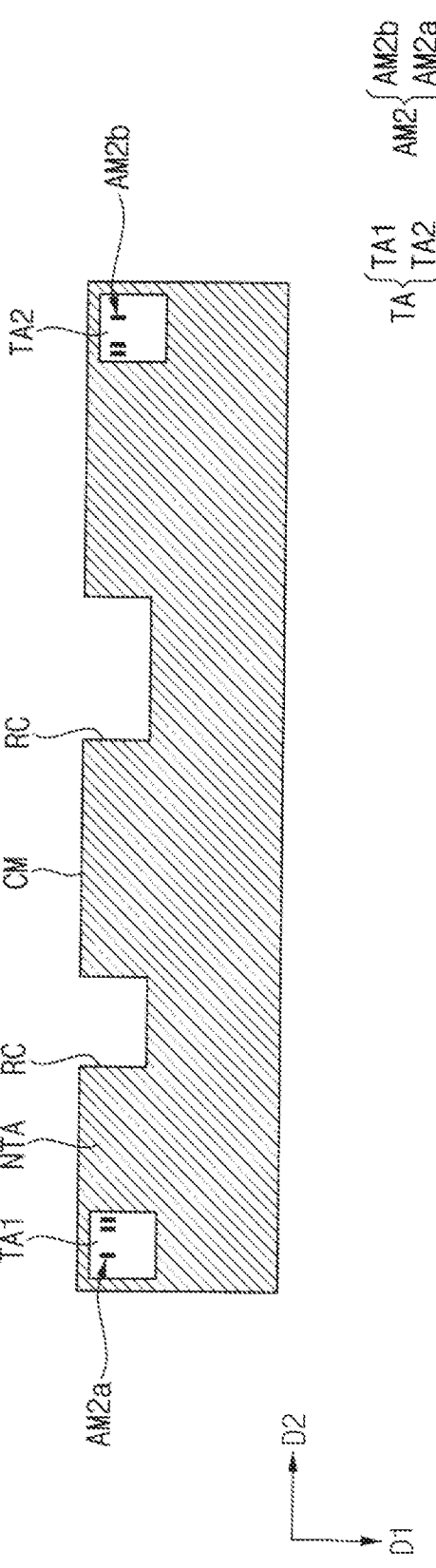
FIG. 5 is a bottom view illustrating a cover member included in the display device of FIG. 2.

FIG. 5 is a bottom view illustrating a cover member CM included in the display device DD of FIG. 2.

Referring to FIGS. 2 and 5, the second alignment mark AM2 for aligning the cover member CM on the display panel DP (and relative to the circuit board CB) may be formed in the transparent area TA of the cover member CM. The second alignment mark AM2 of the cover member CM may correspond to the first alignment mark AM1 of the circuit board CB. The transparent area TA may be transparent except for the second alignment mark AM2.

In an embodiment, the second alignment mark AM2 may be formed using a colored ink or a colored tape. For example, the second alignment mark AM2 may be formed by printing colored ink or attaching a colored tape on the second surface of the cover member CM, using a silk screen printing method.

In an embodiment, the first alignment mark AM1 may have a color different from a color of the second alignment mark AM2. For example, the second alignment mark AM2 may be formed using ink or a tape having a color different from a color of the first alignment mark AM1. In this case, the first alignment mark AM1 and the second alignment mark AM2 which overlap each other may be easily distinguished from each other. In an embodiment, the first alignment mark AM1 and the second alignment mark AM2 may have the same color.

In an embodiment, the second alignment mark AM2 may have a shape in which the first alignment mark AM1 extends to have a major dimension in one direction.

In an embodiment, when the first alignment mark AM1 is provided in plurality, the transparent area TA and the second alignment mark AM2 may also be provided in plurality.

For example, as shown in FIGS. 2 and 5, the transparent area TA may include a first transparent area TA1 and a second transparent area TA2 which are spaced apart from each other. The first transparent area TA1 may correspond to the 1-1st alignment mark AM1a of the circuit board CB, and the second transparent area TA2 may correspond to the 1-2nd alignment mark AM1b of the circuit board CB. For example, the 1-1st alignment mark AM1a may be visually recognized through the first transparent area TA1 of the cover member CM, and the 1-2nd alignment mark AM1b of the cover member CM may be visually recognized through the second transparent area TA2, for the cover member CM which is on and overlapping the circuit board CB (refer to FIG. 2).

The second alignment mark AM2 may include a 2-1st alignment mark AM2a and a 2-2nd alignment mark AM2b formed in the first transparent area TA1 and the second transparent area TA2, respectively. The 2-1st alignment mark AM2a may correspond to the 1-1st alignment mark AM1a of the circuit board CB, and the 2-2nd alignment mark AM2b may correspond to the 1-2nd alignment mark AM1b of the circuit board CB. In an embodiment, the 2-1st alignment mark AM2a may have a shape in which the 1-1st alignment mark AM1a extends, and the 2-2nd alignment mark AM2b may have a shape in which the 1-2nd alignment mark AM1b extends. One among the-1st alignment mark AM2a and the 2-2nd alignment mark AM2b may include a pattern provided in plural including a plurality patterns. The 2-1st alignment mark AM2a and the 2-2nd alignment mark AM2b may be spaced apart from each other.

In an embodiment, the 1-1st alignment mark AM1a and the 2-1st alignment mark AM2a may have different colors from each other. The 1-2nd alignment mark AM1b and the 2-2nd alignment mark AM2b may have different colors from each other. The 1-1st alignment mark AM1a and the 1-2nd alignment mark AM1b may have the same color as each other. The 2-1st alignment mark AM2a and the 2-2nd alignment mark AM2b may have the same color as each other.

FIGS. 6 to 12 are bottom views of area A and area B of FIG. 2.

Hereinafter, various embodiments of the planar shape of the first alignment mark AM1 and the second alignment mark AM2 will be described in detail with reference to FIGS. 6 to 12.

Figure 6:
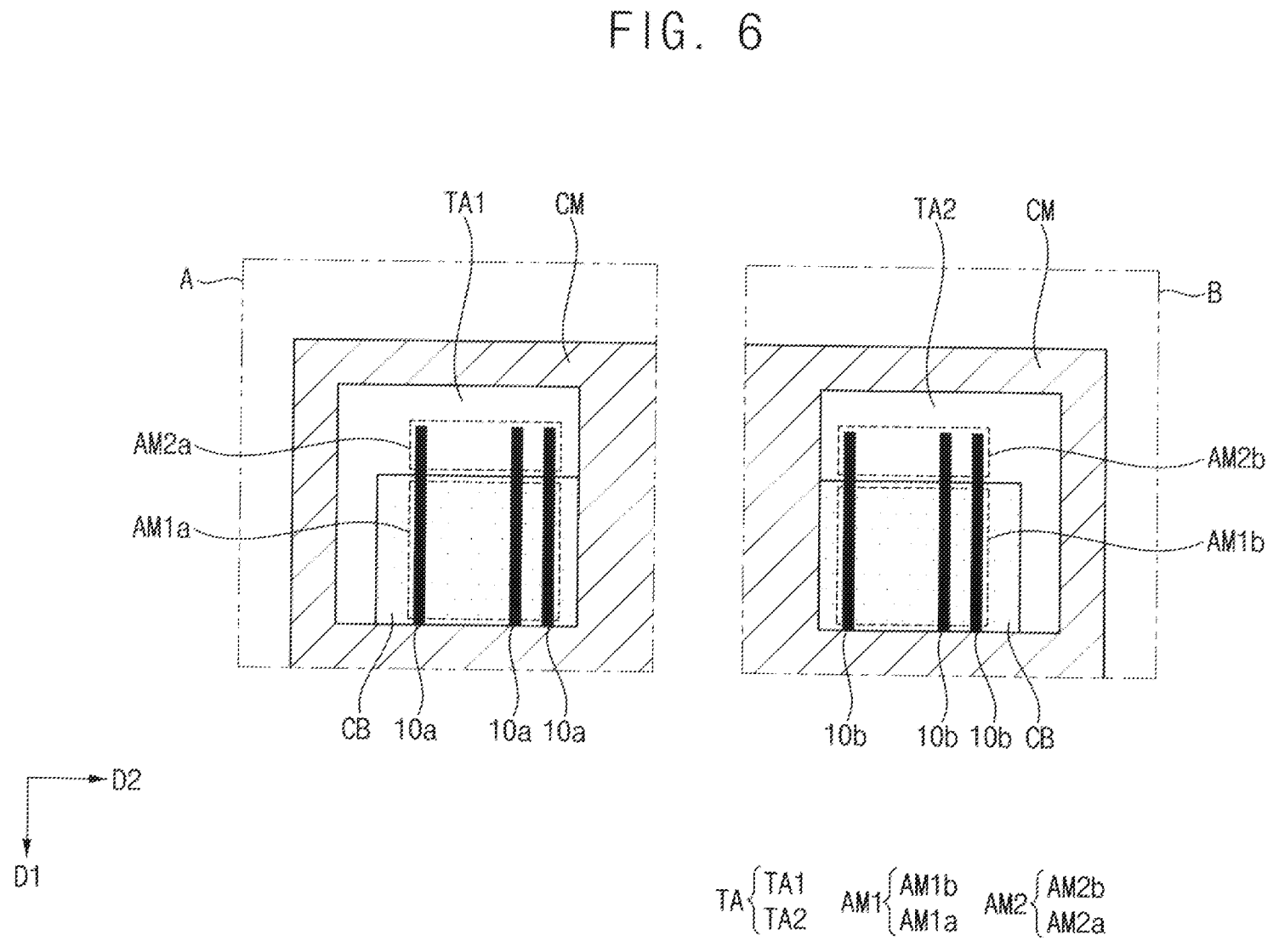

Referring to FIG. 6, in an embodiment, each of the first transparent area TA1 and the second transparent area TA2 may have a rectangular shape in a plan view. Stripe patterns within different transmission areas may extend in same directions.

The 1-1st alignment mark AM1a may include first stripe patterns 10a (e.g., a first stripe shape pattern provided in plural), and the 1-2nd alignment mark AM1b may include second stripe patterns 10b (e.g., a second stripe shape pattern provided in plural). Although the 1-1st alignment mark AM1a includes three first stripe patterns 10a, and the 1-2nd alignment mark AM1b includes three second stripe patterns 10b are shown in FIG. 6, the invention is not limited thereto. For example, the 1-1st alignment mark AM1a may include one, two, four, or more first stripe patterns 10a, and the 1-2nd alignment mark AM1b may include one, two, four, or more second stripe patterns 10b.

In an embodiment, the first stripe patterns 10a may extend in the first direction D1, and may be arranged side by side in the second direction D2 intersecting the first direction D1. For example, the second direction D2 may be perpendicular to the first direction D1, without being limited thereto.

The second stripe patterns 10b may extend in the first direction D1, and may be arranged side by side in the second direction D2.

In an embodiment, as shown in FIG. 6, the 1-1st alignment mark AM1a and the 1-2nd alignment mark AM1b may have different shapes. For example, the first stripe patterns 10a may be arranged at irregular intervals from each other, and the second stripe patterns 10b may be arranged at irregular intervals from each other.

The 2-1st alignment mark AM2a may have a shape in which each of the first stripe patterns 10a of the 1-1st alignment mark AM1a extends. That is, the first alignment mark AM1 of the circuit board CB (e.g., the 1-1st alignment mark AM1a) has a shape extended along the circuit board CB, and the second alignment mark AM2 (e.g., the 2-1st alignment mark AM2a) has a shape which extends along the transparent area TA of the cover member CM and corresponds to a virtual extension of the shape of the first alignment mark AM1. For example, the combination of the 1-1st alignment mark AM1a and the 2-1st alignment mark AM2a may define a single stripe pattern shape, provided in plural and arranged side by side in the second direction D2 in a plan view. The single stripe pattern may be a shape which is continuously extended across a boundary between an outer edge of the circuit board CB and a respective transparent area adjacent to the outer edge of the circuit board CB, in the plan view. For example, a cover member CM and a circuit board CB which are aligned disposes the 1-1st alignment mark AM1a and the 2-1st alignment mark AM2a meeting each other to form a continuous shape of an alignment mark in a respective transparent area. That is, an alignment mark may be defined by a combination of the first alignment mark AM1 of the circuit board CB and the second alignment mark AM2 of the cover member CM.

The 2-2nd alignment mark AM2b may have a shape in which each of the second stripe patterns 10b of the 1-2nd alignment mark AM1b extends. That is, a shape of the 2-2nd alignment mark AM2b may correspond to a virtually extended shape of the 1-2nd alignment mark AM1b (e.g., extended shape of the second stripe pattern 10b). For example, the combination of the 1-2nd alignment mark AM1b and the 2-2nd alignment mark AM2b may define a single stripe pattern shape, provided in plural and arranged side by side in the second direction D2 in a plan view.

Referring to FIG. 7, in an embodiment, each of the first transparent area TA1 and the second transparent area TA2 may have a rectangular shape in a plan view. Stripe patterns within different transmission areas may extend in different directions from each other.

The 1-1st alignment mark AM1a may include first stripe patterns 20a. The first stripe patterns 20a may each extend in the first direction D1 and may be arranged side by side in the second direction D2.

The 1-2nd alignment mark AM1b may include second stripe patterns 20b. The second stripe patterns 20b may extend in the second direction D2 and may be arranged side by side in the first direction D1. For example, the 1-1st alignment mark AM1a and the 1-2nd alignment mark AM1b may have different shapes.

The 2-1st alignment mark AM2a may have a shape in which each of the first stripe patterns 20a of the 1-1st alignment mark AM1a extends. For example, the combination of the 1-1st alignment mark AM1a and the 2-1st alignment mark AM2a may define a single a stripe pattern shape, provided in plural and arranged side by side in the second direction D2 in a plan view.

The 2-2nd alignment mark AM2b may have a shape in which each of the second stripe patterns 20b of the 1-2nd alignment mark AM1b extends. For example, the combination of the 1-2nd alignment mark AM1b and the 2-2nd alignment mark AM2b may define a single stripe pattern shape, provided in plural and arranged side by side in the first direction D1 in a plan view.

Referring to FIG. 8, in an embodiment, each of the first transparent area TA1 and the second transparent area TA2 may have a rectangular shape in a plan view.

The 1-1st alignment mark AM1*a* may include first stripe patterns 30*a*. At least one of the first stripe patterns 30*a* (e.g., first sub-stripe pattern) may extend in the first direction D1 and at least another one of the first stripe patterns 30*a* (e.g., second sub-stripe pattern) may extend in the second direction D2. That is, first sub-alignment marks within a same transparent area may extend in different directions from each other.

One or more of the first stripe patterns 30*a* may define a first stripe pattern group. For example, the first stripe patterns 31*a* (e.g., a first group of first stripe patterns 30*a*) may extend in the first direction D1 and may be arranged side by side in the second direction D2. The first stripe pattern 32*a* (e.g., a second group of first stripe patterns 30*a*) may extend in the second direction D2. For example, the first stripe pattern 32*a* may cross the first stripe patterns 31*a*.

The 1-2nd alignment mark AM1*b* may include second stripe patterns 30*b*. At least one of the second stripe patterns 30*b* may extend in the first direction D1, and at least another one of the second stripe patterns 30*b* may extend in the second direction D2.

One or more of the second stripe patterns 30*b* may define a second stripe pattern group. For example, the second stripe pattern 31*b* (e.g., a first group of second stripe patterns 30*b*) may extend in the first direction D1. The second stripe patterns 32*b* (e.g., a second group of second stripe patterns 30*b*) may each extend in the second direction D2 and may be arranged side by side in the first direction D1. For example, the second stripe pattern 31*b* may cross the second stripe patterns 32*b*. The 1-1st alignment mark AM1*a* and the 1-2nd alignment mark AM1*b* may have different shapes which are defined by the single and continuous extended shapes which cross the outer edge of the circuit board CB and extend into the respective transparent area adjacent to the outer edge of the circuit board CB.

The 2-1st alignment mark AM2*a* may have a shape in which each of the first stripe patterns 30*a* of the 1-1st alignment mark AM1*a* extends. For example, the combination of the 1-1st alignment mark AM1*a* and the 2-1st alignment mark AM2*a* may have a stripe pattern shape in which respective stripe shapes cross each other in a plan view.

The 2-2nd alignment mark AM2*b* may have a shape in which each of the second stripe patterns 30*b* of the 1-2nd alignment mark AM1*b* extends. For example, the combination of the 1-2nd alignment mark AM1*b* and the 2-2nd alignment mark AM2*b* may have a stripe pattern shape in which respective stripe shapes cross each other in a plan view.

Figure 9:
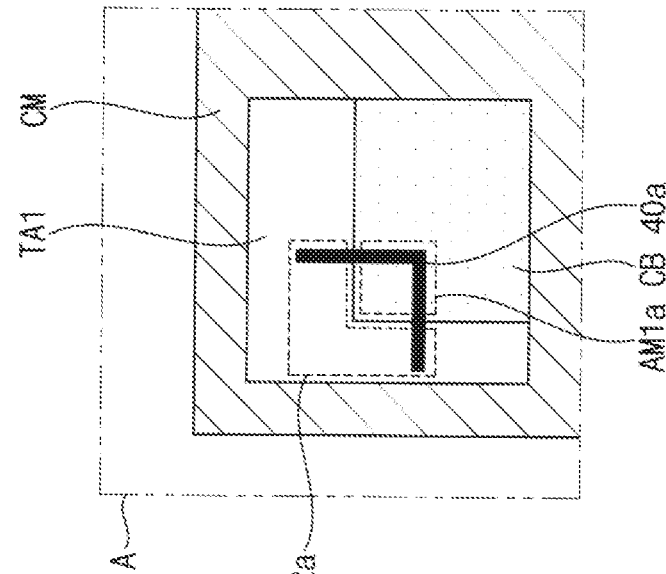
Figure 10:
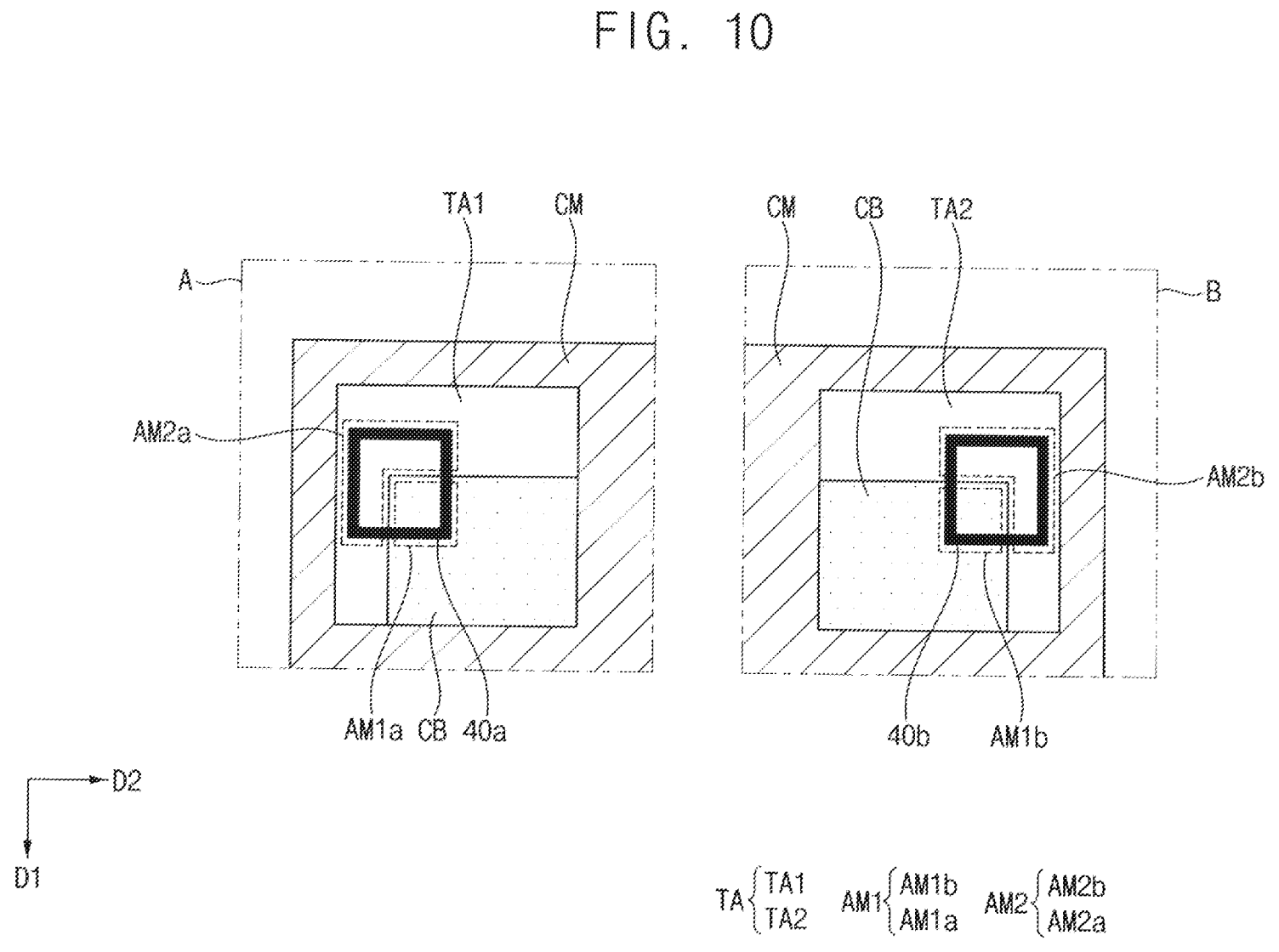

Referring to FIGS. 9 and 10, in an embodiment, each of the first transparent area TA1 and the second transparent area TA2 may have a rectangular shape in a plan view.

The 1-1st alignment mark AM1*a* may be positioned at one corner of the circuit board CB and may include a bent pattern 40*a* bent and extended toward two adjacent edges. Ends of the bent pattern 40*a* may terminate adjacent to the outer edge of the circuit board CB, such as to meet with (or coincide with) the outer edge of the circuit board CB. For example, as a first shape, the bent pattern 40*a* may be positioned at the upper left corner of the circuit board CB and may have a "⌋" shape bent toward the left and upper edges of the circuit board CB (like a backwards "L" shape).

The 1-2nd alignment mark AM1*b* may be positioned at another corner of the circuit board CB and may include a bent pattern 40*b* bent and extended toward two adjacent edges. Ends of the bent pattern 40*b* may terminate adjacent to the outer edge of the circuit board CB, such as to meet with (or coincide with) the outer edge of the circuit board CB. For example, the bent pattern 40*b* may be positioned at an upper right corner of the circuit board CB and may have a "⌊" shape bent toward right and upper edges of the circuit board CB (like an "L" shape).

The 2-1st alignment mark AM2*a* may have a second shape in which the bent pattern 40*a* of the 1-1st alignment mark AM1*a* extends. For example, as shown in FIG. 9, the combination of the 1-1st alignment mark AM1*a* and the 2-1st alignment mark AM2*a* may have a "⌐" shape (e.g., backwards "L" shape) as a whole to define an alignment mark at the first transparent area TA1. For another example, as shown in FIG. 10, the combination of the 1-1st alignment mark AM1*a* and the 2-1st alignment mark AM2*a* may have a "☐" shape (e.g., closed loop or square shape) as a whole to define an alignment mark at the first transparent area TA1.

The 2-2nd alignment mark AM2*b* may have a shape in which the bent pattern 40*b* of the 1-2nd alignment mark AM1*b* extends. For example, as shown in FIG. 9, the combination of the 1-2nd alignment mark AM1*b* and the 2-2nd alignment mark AM2*b* may have a "⌐" shape as a whole. For another example, as shown in FIG. 10, the combination of the 1-2nd alignment mark AM1*b* and the 2-2nd alignment mark AM2*b* may have a "☐" shape as a whole.

Figure 11:
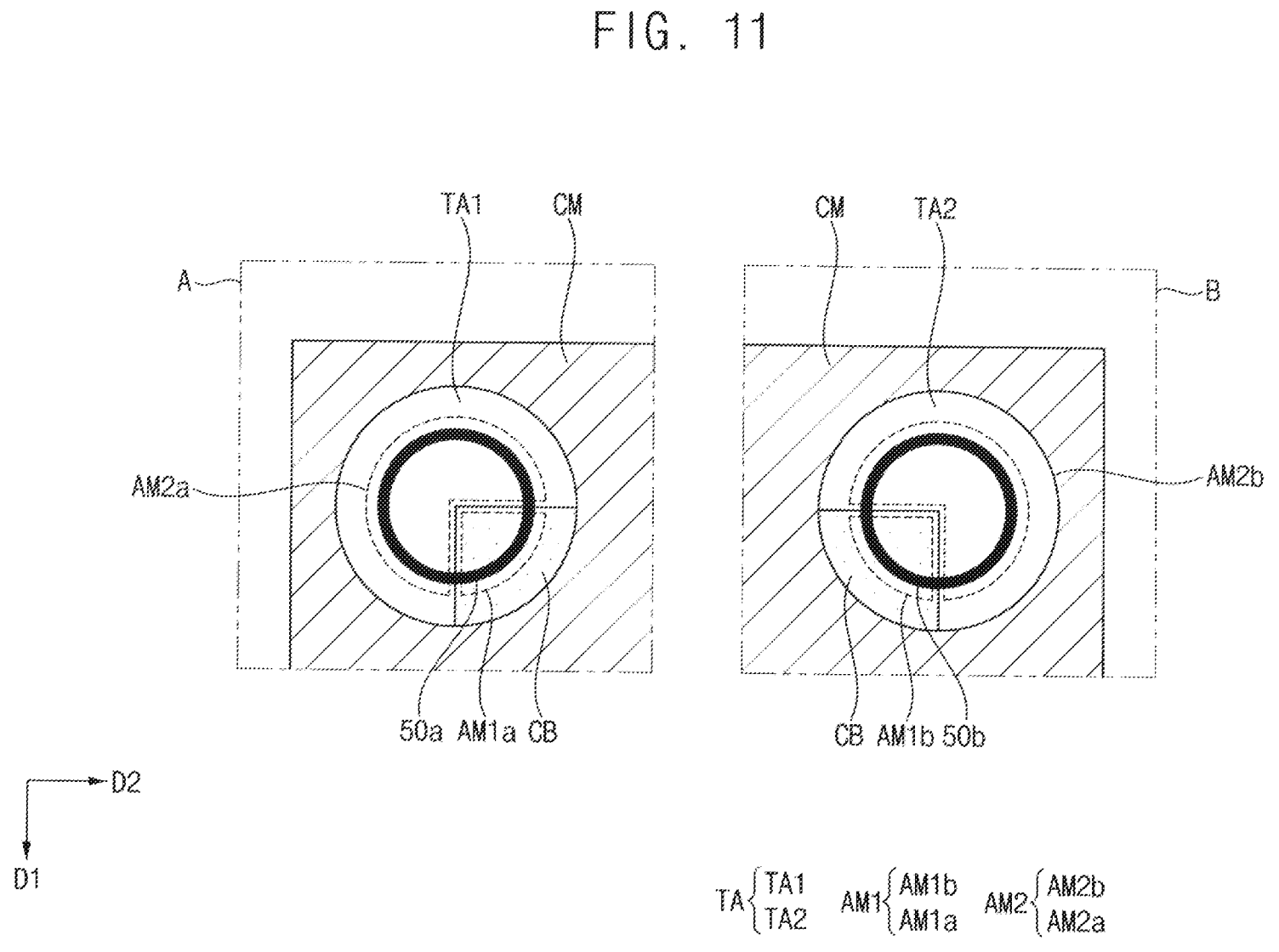
Figure 12:
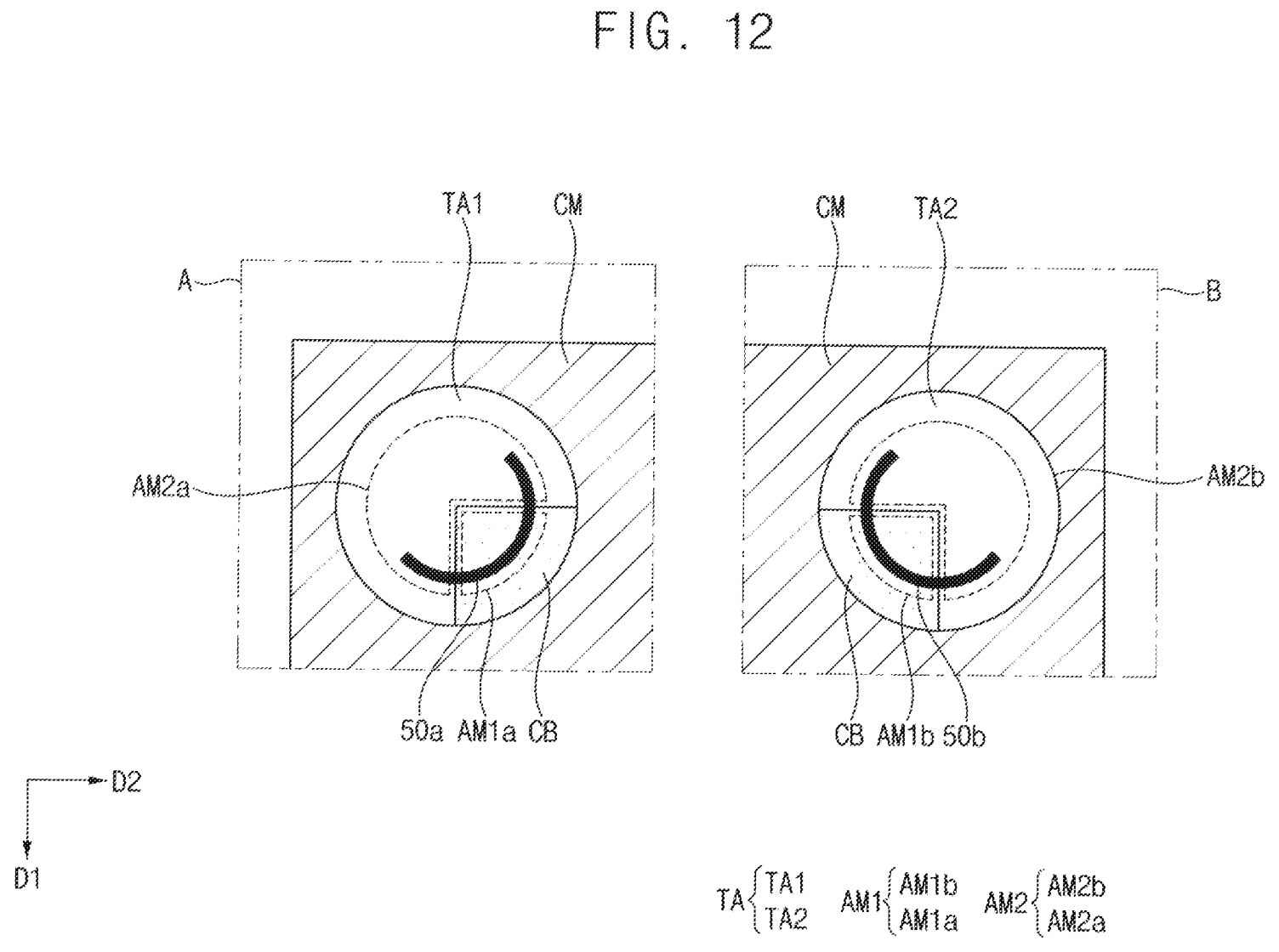

Referring to FIGS. 11 and 12, in an embodiment, each of the first transparent area TA1 and the second transparent area TA2 may have a circular shape in a plan view.

The 1-1st alignment mark AM1*a* may be positioned at one corner of the circuit board CB and may include an arc-shaped pattern 50*a* (e.g., first arc-shaped pattern) bent toward two adjacent edges. For example, the pattern 50*a* may be positioned at the upper left corner of the circuit board CB and may have an arc shape curved toward the left and upper edges of the circuit board CB.

The 1-2nd alignment mark AM1*b* may include an arc-shaped pattern 50*b* bent toward two adjacent edges of the circuit board CB. For example, the pattern 50*b* may be positioned at an upper right corner of the circuit board CB and may have an arc shape curved toward right and upper edges of the circuit board CB.

The 2-1st alignment mark AM2*a* may have a shape in which the pattern 50*a* of the 1-1st alignment mark AM1*a* extends (e.g., a second arc-shaped pattern). For example, as shown in FIG. 11, the combination of the 1-1st alignment mark AM1*a* and the 2-1st alignment mark AM2*a* may have a circular shape as a whole to define an alignment mark at the first transparent area TA1. For another example, as shown in FIG. 12, the combination of the 1-1st alignment mark AM1*a* and the 2-1st alignment mark AM2*a* may have an arc shape as a whole to define an alignment mark at the first transparent area TA1.

The 2-2nd alignment mark AM2*b* may have a shape in which the pattern 50*b* of the 1-2nd alignment mark AM1*b* extends. For example, as shown in FIG. 11, the combination of the 1-2nd alignment mark AM1*b* and the 2-2nd alignment mark AM2*b* may have a circular shape as a whole. For another example, as shown in FIG. 12, the combination of the 1-2nd alignment mark AM1*b* and the 2-2nd alignment mark AM2*b* may have an arc shape as a whole.

As described above, the planar shape of the first alignment mark AM1 and the second alignment mark AM2 according to various embodiments of the invention has been described with reference to FIGS. 6 to 12, but this is an example and the invention is not limited thereto.

Figure 13:
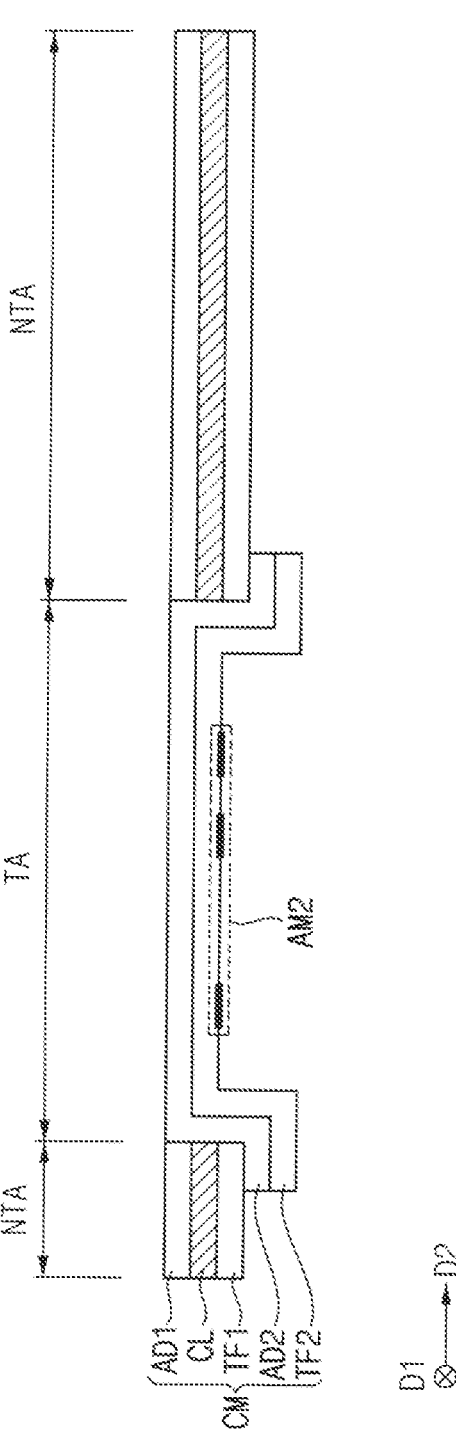
FIG. 13 is a cross-sectional view illustrating the cover member of FIG. 5.

FIG. 13 is a cross-sectional view illustrating the cover member CM of FIG. 5. For example, FIG. 13 is a cross-sectional view illustrating a left portion of the cover member CM of FIG. 5.

Referring to FIGS. 5 and 13, in an embodiment, the cover member CM may include a first transparent adhesive layer AD1, a conductive layer CL, a first transparent film TF1, a second transparent adhesive layer AD2, and a second transparent film TF2. The cover member CM may include the transparent adhesive layer (e.g., the first transparent adhesive layer AD1) which is closest to the circuit board CB, and in order from the transparent adhesive layer, in a direction away from the circuit board CB, the conductive layer CL defining an opening corresponding to the transparent area TA, the first transparent film TF1 defining an opening corresponding to the opening of the conductive layer CL, and the second transparent film TF2 overlapping the transparent area TA and having the second alignment mark AM2.

In an embodiment, the first transparent adhesive layer AD1 may overlap the opaque area NTA and may not overlap the transparent area TA (e.g., may be adjacent to the transparent area TA). For example, the first transparent adhesive layer AD1 may have (or define) an opening overlapping (or corresponding to) the transparent area TA. When the transparent area TA includes the first transparent area TA1 and the second transparent area TA2, the first transparent adhesive layer AD1 has a first opening overlapping the first transparent area TA1 and a second opening overlapping the second transparent area TA2. In an embodiment, a recess RC may be formed in the first transparent adhesive layer AD1.

For example, the first transparent adhesive layer AD1 may include a pressure sensitive adhesive (PSA), an optical clear adhesive (OCA), an optical clear resin (OCR), or the like. The first transparent adhesive layer AD1 may have insulating properties.

The conductive layer CL may be disposed under the first transparent adhesive layer AD1. The conductive layer CL may be disposed between the first transparent adhesive layer AD1 and the first transparent film TF1. The conductive layer CL may include an opaque conductive material to define an opaque conductive layer. Accordingly, the conductive layer CL may shield electromagnetic waves, etc. introduced from the outside.

In an embodiment, the conductive layer CL may have substantially the same planar shape as the first transparent adhesive layer AD1. For example, the conductive layer CL may overlap the opaque area NTA and may not overlap the transparent area TA. The conductive layer CL may have an opening overlapping the transparent area TA. A recess RC may be formed in the conductive layer CL.

The first transparent film TF1 may be disposed under the conductive layer CL. The first transparent film TF1 may include a transparent insulating material. For example, the first transparent film TF1 may include polyethylene terephthalate ("PET"), polyimide ("PI"), polyacrylate, etc., but the invention is not limited thereto.

In an embodiment, the first transparent film TF1 may have substantially the same planar shape as the first transparent adhesive layer AD1 and the conductive layer CL. For example, the first transparent film TF1 may overlap the opaque area NTA and may not overlap the transparent area TA. The first transparent film TF1 may have an opening overlapping the transparent area TA. A recess RC may be formed in the first transparent film TF1. The recesses of the first transparent adhesive layer AD1, the conductive layer CL and the first transparent film TF1 may be aligned with each other to form the recess RC of the cover member CM.

The second transparent adhesive layer AD2 may be disposed under the first transparent film TF1. The second transparent adhesive layer AD2 may overlap the transparent area TA. The second transparent adhesive layer AD2 may be exposed to outside the cover member CM at the opening of the first transparent adhesive layer AD1 at the transparent area TA. The first transparent adhesive layer AD1 together with the second transparent adhesive layer AD2 may define an upper surface of the cover member CM. The second transparent adhesive layer AD2 may extend from the transparent area TA to the opaque area NTA to also overlap a portion of the opaque area NTA adjacent to the transparent area TA. In an embodiment, the second transparent adhesive layer AD2 may cover inner surfaces of the first transparent adhesive layer AD1, the conductive layer CL, and the first transparent film TF1. Inner side surfaces may be defined by a sidewall of the layers which defines the opening at the transparent area TA.

The second transparent film TF2 may be disposed under the second transparent adhesive layer AD2. In an embodiment, the second transparent film TF2 may have substantially the same planar shape as the second transparent adhesive layer AD2. For example, the second transparent film TF2 may overlap the transparent area TA. The second transparent film TF2 may also overlap a portion of the opaque area NTA adjacent to the transparent area TA.

A top surface of the first transparent adhesive layer AD1 may contact the bottom surface (or the bottom surface of the lower layer) of the display panel DP and the second surface of the circuit board CB. For example, a portion of the top surface of the second transparent adhesive layer AD2 may also contact the second surface of the circuit board CB. Accordingly, the cover member CM may be attached to the second surface of the circuit board CB. In an embodiment, the second alignment mark AM2 may be formed in the transparent area TA on the bottom surface of the second transparent film TF2 which is furthest from the circuit board CB.

In an embodiment, in order to manufacture (or provide) the cover member CM, an opaque tape including the first transparent adhesive layer AD1, the conductive layer CL, and the first transparent film TF1 may be prepared. A portion of the opaque tape that overlaps the transparent area TA may be removed. A transparent tape including a second transparent adhesive layer AD2 and a second transparent film TF2 may be attached to the opaque tape to cover the transparent area TA. The second alignment mark AM2 may be formed on the second transparent film TF2 of the transparent tape by printing colored ink using a silk screen printing method or the like or by attaching a colored tape.

Figure 14:
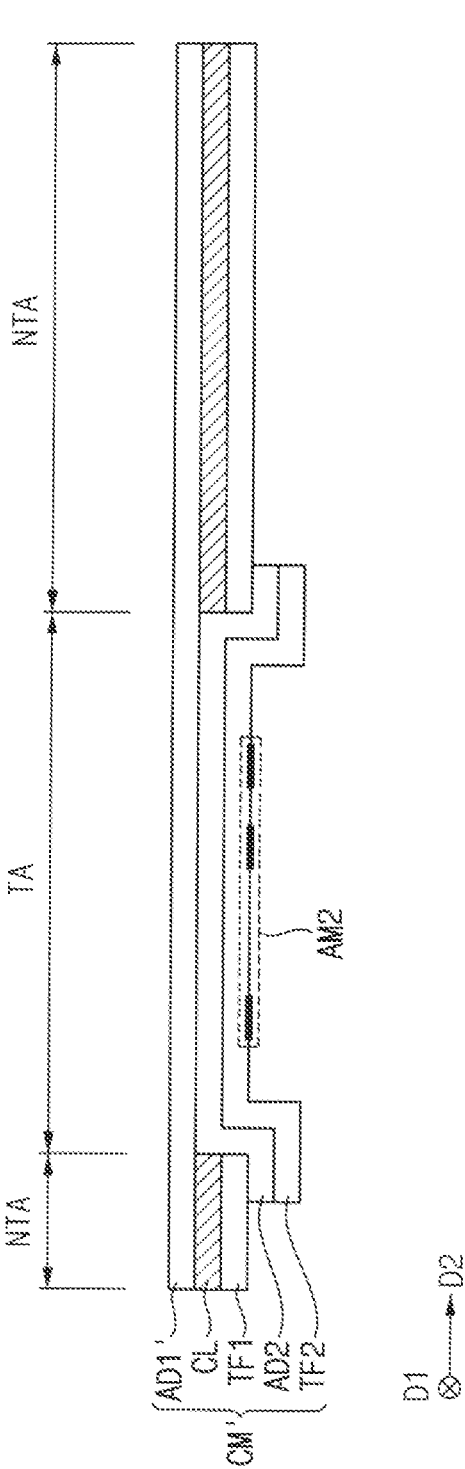
FIG. 14 is a cross-sectional view illustrating a cover member according to an embodiment.

FIG. 14 is a cross-sectional view illustrating a cover member CM' according to an embodiment. For example, the cover member CM' of FIG. 14 may be substantially the same as or similar to the cover member CM described with reference to FIG. 13, except for the configuration of the first transparent adhesive layer AD1'.

In an embodiment, the cover member CM' may include the first transparent adhesive layer AD1', the conductive layer CL, the first transparent film TF1, the second transparent adhesive layer AD2, and the second transparent film TF2.

The first transparent adhesive layer AD1' may entirely overlap the opaque area NTA and the transparent area TA. For example, the first transparent adhesive layer AD1' may continuously extend without having an opening therein. The first transparent adhesive layer AD1' may define an upper surface of the cover member CM'.

The conductive layer CL may be disposed under the first transparent adhesive layer AD1'. The conductive layer CL may include an opaque conductive material. The conductive layer CL may overlap the opaque area NTA and may not overlap the transparent area TA. For example, the conductive layer CL may have an opening overlapping the transparent area TA.

The first transparent film TF1 may be disposed under the conductive layer CL. In an embodiment, the first transparent film TF1 may have substantially the same planar shape as the conductive layer CL.

The second transparent adhesive layer AD2 may be disposed under the first transparent film TF1. The second transparent adhesive layer AD2 may overlap the transparent area TA. The second transparent adhesive layer AD2 may also overlap a portion of the opaque area NTA adjacent to the transparent area TA. A top surface of the second transparent adhesive layer AD2 may contact a bottom surface of the first transparent adhesive layer AD1. In an embodiment, the second transparent adhesive layer AD2 may cover inner surfaces of the conductive layer CL and the first transparent film TF1.

The second transparent film TF2 may be disposed under the second transparent adhesive layer AD2. In an embodiment, the second transparent film TF2 may have substantially the same planar shape as the second transparent adhesive layer AD2.

A top surface of the first transparent adhesive layer AD1' may contact the bottom surface of the display panel DP (or the bottom surface of the lower layer) and the second surface of the circuit board CB. Accordingly, the cover member CM' may be attached to the second surface of the circuit board CB. In an embodiment, the second alignment mark AM2 may be formed in the transparent area TA on the bottom surface of the second transparent film TF2.

In an embodiment, in order to manufacture the cover member CM', an opaque tape including the first transparent adhesive layer AD1', the conductive layer CL, and the first transparent film TF1 may be prepared. A portion of the conductive layer CL and a portion of the first transparent film TF1 which are overlapping the transparent area TA of the opaque tape may be removed. In this case, a portion of the first transparent adhesive layer AD1' may not be removed. A transparent tape including a second transparent adhesive layer AD2 and a second transparent film TF2 may be attached to the opaque tape to cover the transparent area TA. The second alignment mark AM2 may be formed on the second transparent film TF2 by printing colored ink using a silk screen printing method or the like or by attaching a colored tape.

According to embodiments of the invention, the first alignment mark AM1 may be formed on the bottom surface of the circuit board CB disposed under the display panel DP. The cover member CM attached to the bottom surface of the display panel DP to cover the circuit board CB may include a transparent area TA overlapping the first alignment mark AM1. Accordingly, the first alignment mark AM1 may be visually recognized through the transparent area TA of the cover member CM, from outside the cover member CM. In addition, a second alignment mark AM2 corresponding to the first alignment mark AM1 may be formed in the transparent area TA of the cover member CM. Accordingly, the cover member CM may be accurately aligned using the first alignment mark AM1 and the second alignment mark AM2, in attachment of the cover member CM to the bottom surface of the display panel DP having the circuit board CB thereon. Accordingly, it is possible to prevent or reduce interference between a circuit structure (e.g., a driving integrated circuit, a line, etc.) in the circuit board CB and the cover member CM due to misalignment of the cover member CM. Accordingly, the reliability of the display device DD may be improved.

Figure 15:
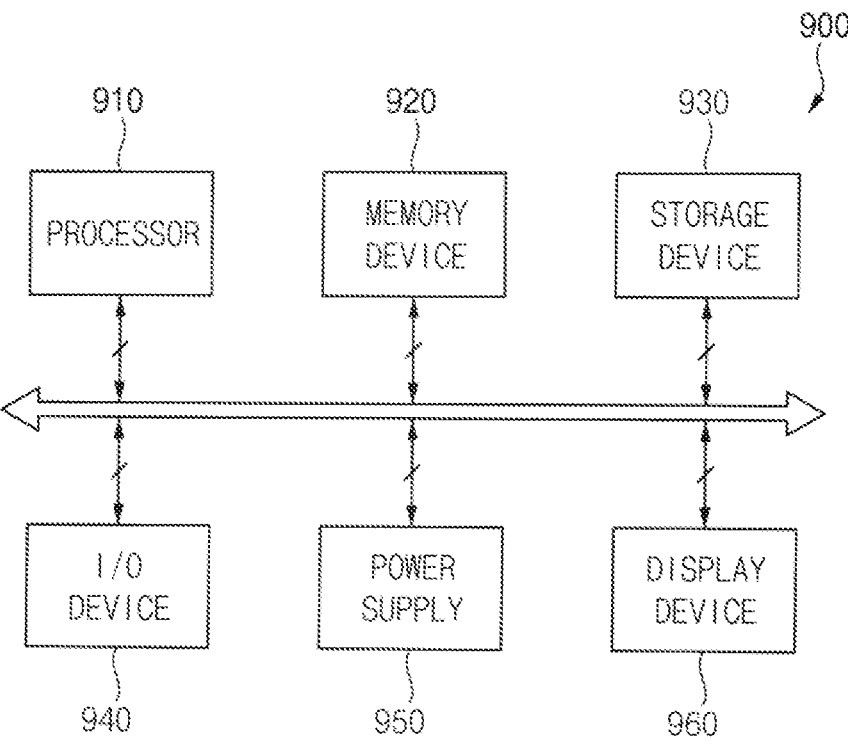
FIG. 15 is a block diagram illustrating an electronic device according to an embodiment.

FIG. 15 is a block diagram illustrating an electronic device 900 according to an embodiment.

Referring to FIG. 15, according to an embodiment, an electronic device 900 may include a processor 910, a memory device 920, a storage device 930, an input/output device 940, a power supply 950, and a display device 960. In this case, the display device 960 may correspond to the display device DD of FIGS. 1 and 2. The electronic device 900 may further include various ports capable of communicating with a video card, a sound card, a memory card, a USB device, and the like. In an embodiment, the electronic device 900 may be implemented as a television. In an embodiment, the electronic device 900 may be implemented as a smartphone. However, the electronic device 900 is not limited thereto, and for example, the electronic device 900 may be implemented as a mobile phone, a video phone, a smart pad, a smart watch, a tablet personal computer (PC), a vehicle navigation system, a computer monitor, a notebook computer, a head mounted display (HMD), or the like.

The processor 910 may perform certain calculations or tasks. In an embodiment, the processor 910 may be a microprocessor, a central processing unit (CPU), an application processor (AP), or the like. The processor 910 may be connected to other components through an address bus, a control bus, a data bus, and the like. In an embodiment, the processor 910 may also be coupled to an expansion bus, such as a peripheral component interconnect (PCI) bus.

The memory device 920 may store data necessary for the operation of the electronic device 900. For example, the memory device 920 may include an erasable programmable read-only memory (EPROM) device, an electrically erasable programmable read-only memory (EEPROM) device, a flash memory device, and a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) devices, a dynamic random access memory (DRAM) devices, a static random access memory (SRAM) devices, a mobile DRAM devices, etc.

The storage device 930 may include a solid state drive (SSD), a hard disk drive (HDD), a CD-ROM, and the like. The input/output device 940 may include input means such as a keyboard, a keypad, a touch pad, a touch screen, and a mouse, and an output means such as a speaker and a printer.

The power supply 950 may supply power required for the operation of the electronic device 900. The display device 960 may be coupled to other components through buses or other communication links. According to an embodiment, the display device 960 may be included in the input/output device 940.

Although certain embodiments and implementations have been described herein, other embodiments and modifications will be apparent from this description. Accordingly, embodiments of the invention are not limited to such embodiments, but rather to the broader scope of the appended claims and various obvious modifications and equivalent arrangements as would be apparent to a person of ordinary skill in the art.

What is claimed is:

1. A display device comprising:
a display panel;
a circuit board facing the display panel and connected to the display panel, the circuit board including:
a first surface facing the display panel,
a second surface which is opposite to the first surface, and
a first alignment mark on the second surface, the first alignment mark having an end;
a cover member facing the display panel with the circuit board therebetween, the cover member including:
a transparent area corresponding to the first alignment mark, and
a second alignment mark in the transparent area; and
an alignment mark defined by the second alignment mark of the cover member continuously extending from the end of the first alignment mark of the circuit board.

2. The display device of claim 1, wherein
the first alignment mark of the circuit board has a shape extended along the circuit board, the shape defining the end of the first alignment mark, and
the second alignment mark has a shape which extends from the end of the first alignment mark and along the transparent area of the cover member in a direction away from the first alignment mark, the shape of the second alignment mark from the first alignment mark being a virtual extension of the shape of the first alignment mark.

3. The display device of claim 2, wherein the shape of the first alignment mark of the circuit board is a stripe shape pattern.

4. The display device of claim 3, wherein the first alignment mark of the circuit board includes the stripe shape pattern provided in plural including a plurality of stripe shape patterns which extend in a first direction and are arranged in a second direction which crosses the first direction.

5. The display device of claim 3, wherein the first alignment mark of the circuit board includes:
the stripe shape pattern provided in plural including a plurality of stripe shape patterns, and
among the plurality of stripe shape patterns, a first stripe pattern extends in a first direction, and a second stripe pattern extends in a second direction which crosses the first direction.

6. The display device of claim 1, wherein each of the first alignment mark of the circuit board and the second alignment mark of the cover member includes a colored ink or a colored tape.

7. The display device of claim 1, wherein
each of the first alignment mark of the circuit board and the second alignment mark of the cover member has a color, and
the color of the first alignment mark is different from the color of the second alignment mark.

8. The display device of claim 1, wherein the circuit board further includes the first alignment mark provided in plural including a 1-1st alignment mark and a 1-2nd alignment mark spaced apart from each other.

9. The display device of claim 8, wherein
each of the 1-1st alignment mark and the 1-2nd alignment mark has a shape extended along the circuit board, and
the shape of the 1-1st alignment mark is different from the shape of the 1-2nd alignment mark.

10. The display device of claim 8, wherein
the circuit board further includes opposing ends which are opposite to each other, and
the 1-1st alignment mark and the 1-2nd alignment mark are respectively on the opposing ends of the circuit board.

11. The display device of claim 8, wherein the cover member further includes:
the transparent area provided in plural including a first transparent area and a second transparent area,
the first transparent area corresponding to the 1-1st alignment mark of the circuit board, and
the second transparent area corresponding to the 1-2nd alignment mark of the circuit board and spaced apart from the first transparent area.

12. The display device of claim 11, wherein the cover member further includes:
the second alignment mark provided in plural including a 2-1st alignment mark and a 2-2nd alignment mark,
the 2-1st alignment mark in the first transparent area, and
the 2-2nd alignment mark in the second transparent area.

13. The display device of claim 12, wherein
each of the 1-1st alignment mark and the 1-2nd alignment mark of the circuit board has a shape extended along the circuit board,
the 2-1st alignment mark of the cover member has a shape which extends along the first transparent area of the cover member and corresponds to a virtual extension of the shape of the 1-1st alignment mark of the circuit board, and
the 2-2nd alignment mark of the cover member has a shape which extends along the second transparent area of the cover member and corresponds to a virtual extension of the shape of the 1-2nd alignment mark of the circuit board.

14. The display device of claim 13, wherein
the 1-1st alignment mark of the circuit board includes a first stripe shape pattern provided in plural including a plurality of first stripe patterns, and
the 1-2nd alignment mark of the circuit board includes a second stripe shape pattern provided in plural including a plurality of second stripe patterns.

15. The display device of claim 14, wherein
the plurality of first stripe patterns extend in a first direction and are arranged in a second direction which crosses the first direction, and
the plurality of second stripe patterns extend in the first direction and are arranged in the second direction.

16. The display device of claim 14, wherein
the first stripe patterns extend in a first direction and are arranged in a second direction which crosses the first direction, and
the second stripe patterns extend in the second direction and are arranged in the first direction.

17. The display device of claim 14, wherein
among the plurality of first stripe patterns, at least one of the first stripe patterns extends in a first direction and at least another one of the first stripe patterns extends in a second direction which crosses the first direction, and
among the plurality of second stripe patterns, at least one of the second stripe patterns extends in the first direction, and at least another one of the second stripe patterns extends in the second direction.

18. The display device of claim 1, wherein the cover member further includes:
a transparent adhesive layer which is closest to the circuit board; and in order from the transparent adhesive layer, in a direction away from the circuit board:

a conductive layer defining an opening corresponding to the transparent area;

a first transparent film defining an opening corresponding to the opening of the conductive layer; and a second transparent film overlapping the transparent area and having the second alignment mark.

19. A display device, comprising:

a display panel;

a circuit board facing the display panel and connected to the display panel, the circuit board including:

opposing ends which are opposite to each other, a first surface facing the display panel, and a second surface opposite to the first surface, the second surface including a 1-1st alignment mark and a 1-2nd alignment mark and respectively at the opposing ends of the circuit board, each of the 1-1st alignment mark and the 1-2nd alignment mark having an end;

a cover member facing the display panel with the circuit board therebetween, the cover member including:

a first transparent area corresponding to the 1-1st alignment mark of the circuit board, a second transparent area corresponding to the 1-2nd alignment mark of the circuit board, a 2-1st alignment mark in the first transparent area, and a 2-2nd alignment mark in the second transparent area; and a plurality of alignment marks respectively defined by:

the 2-1st alignment mark of the cover member continuously extending from the end of the 1-1st alignment mark of the circuit board, and the 2-2nd alignment mark of the cover member continuously extending from the end of the 1-2nd alignment mark of the circuit board.

20. The display device of claim 19, wherein each of the 1-1st alignment mark and the 1-2nd alignment mark of the circuit board has a shape extended along the circuit board and defining the end of the 1-1st alignment mark and the 1-2nd alignment mark, respectively, the 2-1st alignment mark of the cover member has a shape which extends from the end of the 1-1st alignment mark and along the first transparent area of the cover member in a direction away from the 1-1st alignment mark, the shape of the 2-1st alignment mark being a virtual extension of the shape of the 1-1st alignment mark, and the 2-2nd alignment mark of the cover member has a shape which extends from the end of the 1-2nd alignment mark and along the second transparent area of the cover member in a direction away from the 1-2nd alignment mark, the shape of the 2-2nd alignment mark being a virtual extension of the shape of the 1-2nd alignment mark.

* * * * *